(12) United States Patent
Poplevine et al.

(10) Patent No.: US 7,453,726 B1
(45) Date of Patent: Nov. 18, 2008

(54) NON-VOLATILE MEMORY CELL WITH IMPROVED PROGRAMMING TECHNIQUE AND DENSITY

(75) Inventors: Pavel Poplevine, Foster City, CA (US); Annie-Li-Keow Lum, Milpitas, CA (US); Andrew Cao, Fremont, CA (US); Ernes Ho, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/656,609

(22) Filed: Jan. 23, 2007

(51) Int. Cl.
*G11C 11/34* (2006.01)
*G11C 14/00* (2006.01)

(52) U.S. Cl. ............. 365/185.08; 365/154; 365/185.05; 365/185.14; 365/202

(58) Field of Classification Search ............ 365/185.08, 365/154, 185.05, 185.14, 185.19, 202
See application file for complete search history.

(56) References Cited

U.S. PATENT DOCUMENTS

| | | | |
|---|---|---|---|
| 5,646,885 A | 7/1997 | Matsuo et al. | 365/185.05 |
| 6,137,723 A | 10/2000 | Bergemont et al. | 365/185.18 |
| 6,707,702 B1* | 3/2004 | Komatsuzaki | 365/145 |
| 6,903,978 B1 | 6/2005 | Mirgorodski et al. | 365/185.28 |
| 6,985,386 B1 | 1/2006 | Mirgorodski et al. | 365/185.05 |
| 6,992,927 B1 | 1/2006 | Poplevine et al. | 365/185.05 |
| 7,020,027 B1 | 3/2006 | Poplevine et al. | 365/185.28 |
| 7,042,763 B1 | 5/2006 | Mirgorodski et al. | 365/185.05 |
| 7,164,606 B1 | 1/2007 | Poplevine et al. | 356/185.28 |
| 7,167,392 B1 | 1/2007 | Poplevine et al. | 365/185.08 |
| 2004/0125644 A1* | 7/2004 | Komatsuzaki | 365/154 |

* cited by examiner

*Primary Examiner*—Richard Elms
*Assistant Examiner*—Toan Le
(74) *Attorney, Agent, or Firm*—Stallman & Pollock LLP

(57) ABSTRACT

A single 4-transistor non-volatile memory (NVM) cell includes a shared static random access memory cell. The NVM cell utilizes a reverse Fowler-Nordheim tunneling programming technique that, in combination with the shared SRAM cell structure, allows an entire cell array to be programmed at two cycles. A single NVM cell approach with shared SRAM allows a 50% area reduction with an insignificant increase in program time.

5 Claims, 7 Drawing Sheets

NON-VOLATILE MEMORY CELL WITH IMPROVED PROGRAMMING TECHNIQUE AND DENSITY

TECHNICAL FIELD

The present invention relates to integrated circuit memory devices and, in particular, to a non-volatile memory (NVM) 4-transistor single cell structure that includes a shared static random access memory (SRAM) cell.

BACKGROUND OF THE INVENTION

Co-pending and commonly-assigned U.S. patent application Ser. No. 11/183,198, filed on Jul. 15, 2005, by Poplevine et al. titled "Non-volatile Memory Cell with Improved Programming Technique" and which is the subject of a Notice of Allowance issued by the U.S. Patent Office on Nov. 2, 2006, discloses a 4-transistor PMOS non-volatile memory (NVM) cell that includes an embedded static random access memory (SRAM) cell. The NVM cell utilizes a reverse Fowler-Nordheim tunneling programming technique with a very low programming current that allows an entire NVM cell array to be programmed at a single cycle. Application Ser. No. 11/183,198 is incorporated herein by reference to provide background information regarding the present invention.

Co-pending and commonly-assigned U.S. patent application Ser. No. 11/182,115, filed on Jul. 15, 2005, by Poplevine et al., titled "Reverse Fowler-Nordheim Tunneling Programming for Non-volatile Memory Cell," discloses a low current programming method for a non-volatile memory (NVM) cell utilizing reverse Fowler-Nordheim tunneling. Application Ser. No. 11/182,115 is incorporated herein by reference to provide background information regarding the present invention.

Co-pending and commonly-assigned U.S. patent application Ser. No. 11/235,834, filed on Sep. 26, 2005, by Poplevine et al., titled "Method of Hot Electron Injection Programming of a Non-volatile Memory (NVM) Cell Array in a Single Cycle," discloses a 4-transistor non-volatile memory (NVM) cell that includes a static random access memory (SRAM) cell. The cell utilizes a hot electron injection programming technique which, in combination with the SRAM cell and a sequence of cascaded pass gates, allows an entire NVM cell array, or a selected row or sector of the array, to be programmed at a single cycle. Application Ser. No. 11/235,834 is incorporated herein by reference to provide background information regarding the present invention.

SUMMARY OF THE INVENTION

The present invention provides a single 4-transistor non-volatile memory (NVM) cell that includes a static random access memory (SRAM) cell that is shared with two NVM cells. The NVM cell utilizes a reverse Fowler-Nordheim tunneling programming technique that, in combination with the shared SRAM cell structure, allows an entire cell array to be programmed at two cycles. A single NVM cell approach with shared SRAM allows a 50% area reduction with an insignificant increase in program time.

The features and advantages of the present invention will be more fully understood and appreciated upon review and consideration of the following detailed description of the invention and the accompanying drawings that set forth illustrative embodiments of the invention.

DETAILED DESCRIPTION OF THE INVENTION

Figure 1:
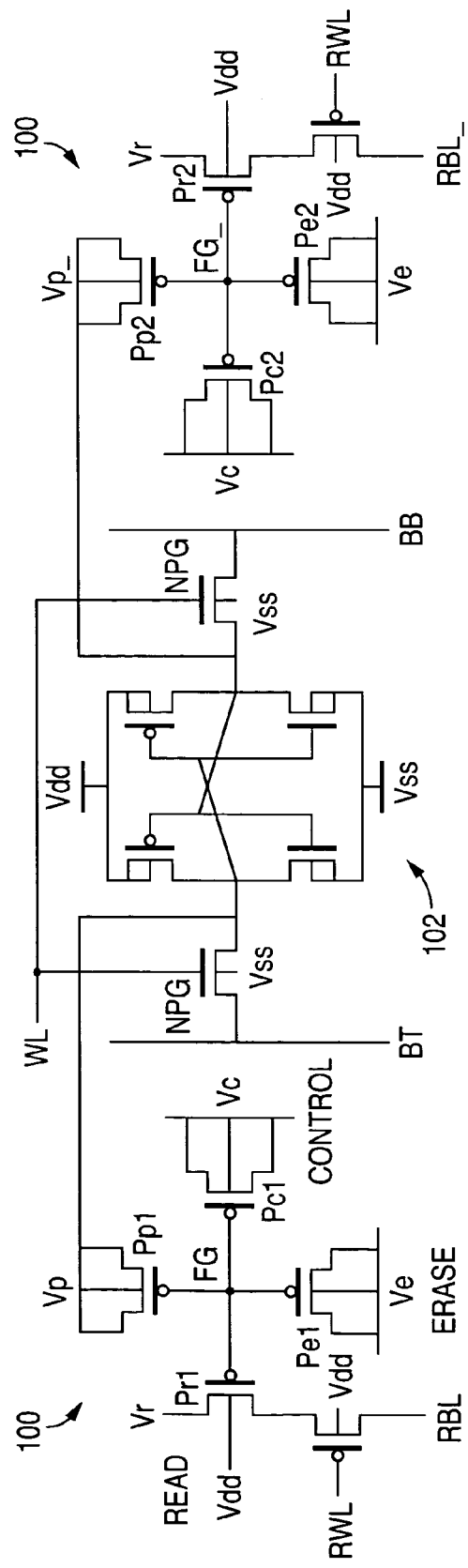
FIG. 1 is a schematic drawing illustrating a known dual non-volatile memory (NVM) cell with a 6 transistor static random access memory (SRAM) cell.

FIG. 1 shows a schematic of a known dual 4T NVM cell 100 with an embedded SRAM cell 102. In this dual NVM cell approach, one NVM cell 100 stores the data and the other NVM cell 100 serves as a reference. This approach increases the cell area by approximately 30% with the additional reference cell. To decrease the cell area, or in other words, to increase the capacity of the memory bit, the present invention provides a single NVM cell approach with a shared SRAM cell.

Figure 2A:
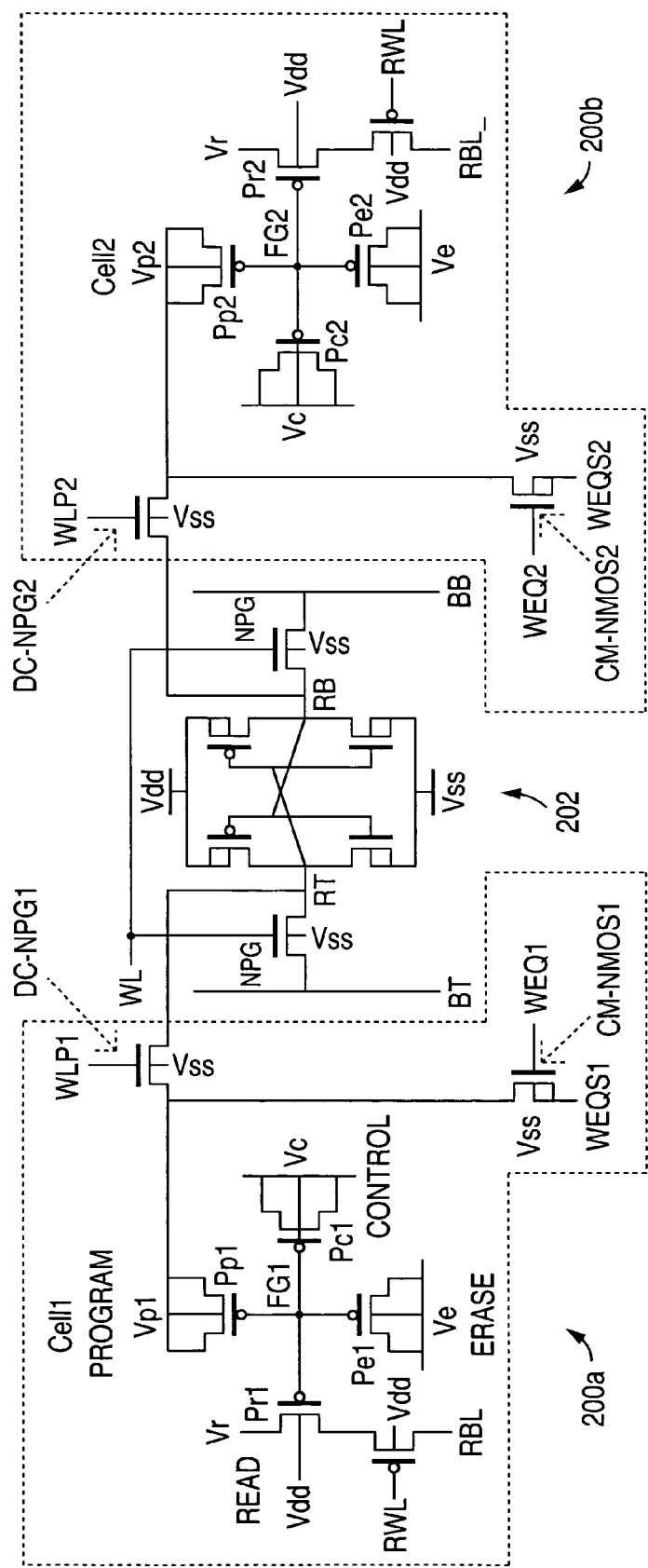
FIG. 2A is a schematic drawing illustrating a dual NVM cell with a shared SRAM, DC-NPG and CM-NMOS in accordance with the present invention.

As shown in FIG. 2A, a NVM cell structure in accordance with the present invention is based upon the FIG. 1 dual 4T NVM cell with a 6T static random access memory (SRAM) cell embedded. In addition, the cell includes two decoupling N-channel pass gates DC-NPG1, DC-NPG2 and two equalize N-channel devices CM-NMOS1, CM-NMOS2. The dual NVM cells, i.e. cell 200a and cell 200b, are treated as two separate memory bits, sharing a single SRAM cell 202. Both NVM cells 200 have their own program control lines WLP1, WEQ1, WEQS1 and WLP2, WEQ2, WEQS2, as shown in FIG. 2A.

With the inclusion of the pass gates and the equalize devices, both NVM cells 200 can be programmed independently. Since the control line for a program operation is globally connected, to program NVM cell 200a, NVM cell 200b must be inhibited from the cell 200a program and vice versa. This is done, in the case of cell 200a program, for example, by setting the cell 200b signals as follows: WLP2 to ground, WEQ2 to Vdd and WEQS2 to Vdd. Turning on the equalize device CM-NMOS2 associated with cell 200b passes voltage at WEQ2 to program device Vp2 of cell 200b. Since it is an NMOS, program device Vp2 will be at Vdd−Vthn. This will inhibit cell 200b from being programmed. To program cell 200a, signal WLP1 and signal WEQS1 are set to Vdd and signal WEQ1 is set to ground. The pass gate DC-NPG1 associated with cell 200a will pass the data from the SRAM cell 202 to Vp1. Vp1 will be at ground level if node RT in the SRAM cell 202 is at ground. Vp1 will be a Vdd−Vthn if node RT is at Vdd level. Ground level at Vp1 or data zero at node RT of the SRAM will cause cell to be programmed. Vdd−Vthn level at Vp1 or Vdd at RT of SRAM 202 will inhibit cell 200a from being programmed.

Figure 2B:
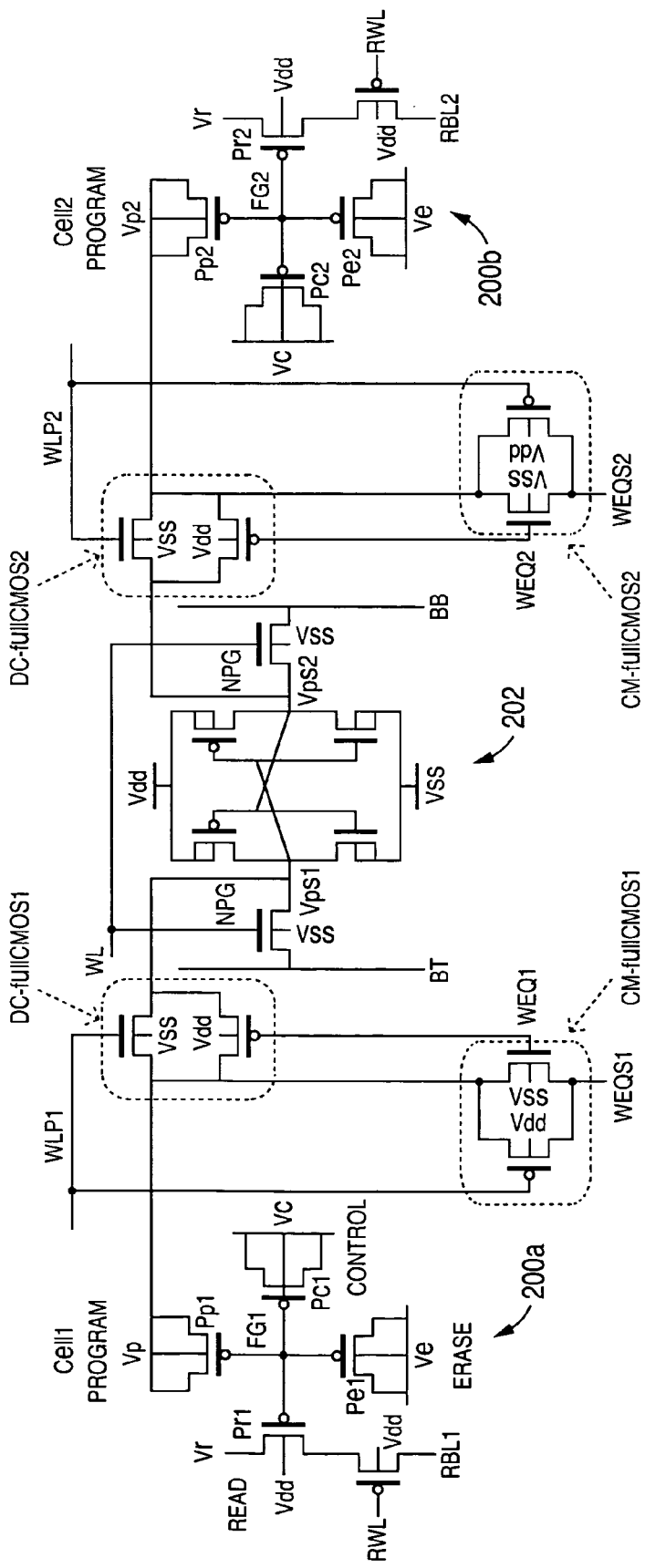
FIG. 2B is a schematic drawing illustrating a dual NVM cell with a shared SRAM cell and full pass-gate in accordance with the present invention.

Similarly, to program cell 200b, cell 200a is inhibited from being programmed. This is done by setting cell 200a as follows: WLP1 to ground, WEQ1 and WEQS1 to Vdd. The equalize device CM-CMOS1 associated with cell 200a will pass voltage at WEQS1 to Vp1. Since it is an NMOS device, Vp1 will be at Vdd−Vthn. This will inhibit cell 200a from being programmed. To program cell 200b, WLP2 and WEQS2 are brought to Vdd and WEQ2 is brought to ground. Pass gate DC-NPG2 will pass the data from the SRAM 202 to Vp2. Vp2 will be at ground level if SRAM node RB is at ground. Vp2 will be at Vdd−Vthn if node RB is at Vdd level. Ground level at Vp2 or data zero at node RB of SRAM 202 will cause cell 200b to be programmed. Vdd−Vthn level at Vp2 or Vdd at node RB of SRAM will inhibit cell 200b from being programmed. To further enhance the cell by passing full VDD (on Vp1/Vp2) to better inhibit the cell from program disturb, an alternate embodiment cell structure is proposed as shown in FIG. 2B. The operation of the FIG. 2B cell structure is identical to the operation of the FIG. 2A cell.

To further enhance the cell by passing full VDD (on Vp1/Vp2) to better inhibit the cell from program disturb, an alternate embodiment cell structure is proposed as shown in FIG. 2B. The operation of the FIG. 2B cell structure is identical to the operation of the FIG. 2A cell.

With the inclusion of the full CMOS pass gates and the full CMOS equalize devices, both NVM cells 200 can be programmed independently. Since the control line for a program operation is globally connected, to program NVM cell 200a, NVM cell 200b must be inhibited from the cell 200a program and vice versa. This is done, in the case of cell 200a program, for example, by setting the cell 200b signals as follows: WLP2 to ground, WEQ2 to Vdd and WEQS2 to Vdd. Turning on the equalize device CM-fullCMOS2 associated with cell 200b passes voltage at WEQ2 to program device Vp2 of cell 200b. Since these are a PMOS and NMOS (full CMOS pass gate) program device Vp2 will be at full Vdd level. This will inhibit cell 200b from being programmed. To program cell 200a, signal WLP1 and signal WEQS1 are set to Vdd and signal WEQ1 is set to ground. The full pass gate DC-fullCMOS1 associated with cell 200a will pass the data from the SRAM cell 202 to Vp1. Vp1 will be at ground level if node RT in the SRAM cell 202 is at ground. Vp1 will be a full Vdd if node RT is at Vdd level. Ground level at Vp1 or data zero at node RT of the SRAM will cause cell to be programmed. Vdd level at Vp1 or Vdd at RT of SRAM 202 will inhibit cell 200a from being programmed.

Similarly, to program cell 200b, cell 200a is inhibited from being programmed. This is done by setting cell 200a as follows: WLP1 to ground, WEQ1 and WEQS1 to Vdd. The equalize device CM-fullCMOS1 associated with cell 200a will pass voltage at WEQS1 to Vp1. Since it is an NMOS device, Vp1 will be at Vdd−Vthn. This will inhibit cell 200a from being programmed. To program cell 200b, WLP2 and WEQS2 are brought to Vdd and WEQ2 is brought to ground. The pass gate DC-fullCMOS2 will pass the data from the SRAM 202 to Vp2. Vp2 will be at ground level if SRAM node RB is at ground. Vp2 will be at full Vdd level if node RB is at Vdd level. Ground level at Vp2 or data zero at node RB of SRAM 202 will cause cell 200b to be programmed. Vdd level at Vp2 or Vdd at node RB of SRAM 200b will inhibit cell 200b from being programmed.

In the case of the FIG. 2A cell architecture, the two NVM cells 200a, 220b can be read either simultaneously by having two sense amplifiers or sequentially through a multiplexer. During a read operation, signals WEQ1 and WEQ2 are at Vdd. WLP1, WLP2, WEQS1 and WEQS2 are at ground. The SRAM 202 is decoupled from both NVM cells. Signals WEQ1, WEQS1 and WEQ2, WEQS2 set up a common ground at Wp1 and Wp2, respectively. The data is sensed by comparing the current/voltage with a global reference current/voltage. The reference current/voltage is usually provided by a single or a group of the 4T cell replica.

During program mode, Vr and Ve are connected to Vdd to prevent the read (Pr1, Pr2) and erase (Pe1, Pe2) transistors from being programmed. Vdd can be any voltage that is high enough to provide shielding against program but low enough not to cause any disturb. To program a cell, a data zero/ground has to be passed into the Vp1/Vp2 from the SRAM 202. To shield the 4T cell from program disturb, a data one is passed to Vp1/Vp2 via the pass gate DC-NPG. Since the pass gate DC-NPG is a NMOS, the voltage level appears on Vp1/Vp2 in Vdd−Vthn. The transmission is done by setting (WLP1, WLP2) to logic high and (WEQ1, WEQ2) to logic low. (WEQS1, WEQS2) are always high during program mode.

During Program (A) The control gate voltage Vc which is globally connected is swept from 0V to $V_{cmax}$ in program time Tprog and stay at $V_{cmax}$ for another Tprog period. Tprog is around 50 ms-100 ms, which will affect the amount of charge tunneling to the floating gates. $V_{cmax}$ depends on the tunneling threshold and the amount of negative charge to put on the floating gate. This voltage varies from technology to technology. Voltage applied to Vc is coupled through control transistor (Pc1, Pc2) to the floating gate (FG1, FG2), increasing floating gate voltage. When the voltage at the floating gate reaches the tunneling threshold, electrons tunnel from the drain/source of the program (whichever Pp1 or Pp2 that is at ground) transistor to the floating gate, making the gate more negative. At the end of the program cycle, Vc is ramped down to 0 v. The floating gates will be left at a net negative charge from the Reverse FN-tunneling program.

During erase mode, RWL, (WEQ1, WEQ2) are at logic high while (WLP1, WLP2, WEQS1, WEQS2) are at logic low. The rest of signals are grounded. The erase voltage Ve is applied (~10V for 70 Å, ~16V for 120 Å). Erase will affect all cells. Ve varies from technology to technology.

Except for program operation, signals WLP1, WLP2, WEQS1 and WEQS2 are always low and signals WEQ1 and WEQ2 are always high for erase and read operation. The shared SRAM 202 is always decoupled from NVM cells 200a, 200b except during program mode.

Figure 3:
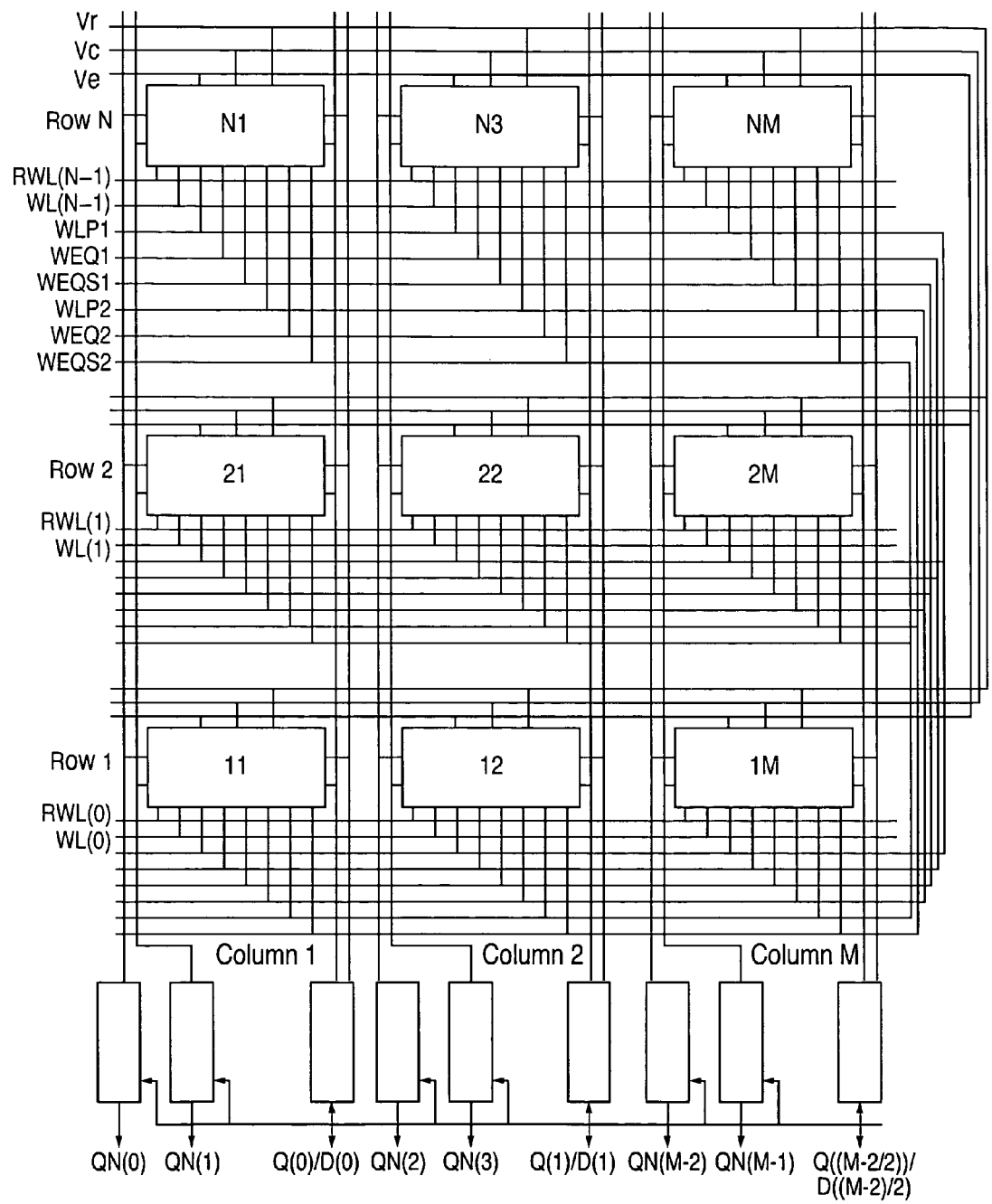
FIG. 3 is a schematic drawing illustrating an array implementation of the NVM cell structure of FIG. 2A or FIG. 2B in accordance with the present invention.

FIG. 3 shows the implementation of an array using either the cell architecture shown in FIG. 2A or in FIG. 2B. The array 300 has N rows and M columns. The SRAM word line (WL) selects the row to be written or read from the SRAM cell 202. The NVM read word line (RWL) selects the row to be read from the dual 4T NVM cell. The erase voltage (Ve), the control voltage (Vc) and the read voltage (Vr) are applied to all cells directly without any high voltage switches or other supporting circuitry, thereby significantly simplifying the connection from external or internal power sources. As discussed above, WLP1, WLP2, WEQS1, WEQS2 and WEQ1, WEQ2 are used to decouple the SRAM 202 from NVM cells during read and to couple the SRAM to the selected NVM cell during program.

The following is a description of the erase, program and read modes pertaining to the array 300 in FIG. 3.

Program Mode

The program mode consists of five steps.

1) Erase mode
2) Write data into SRAM which will be programmed into cell1
3) Enable program cycle 4) Write data into SRAM which will be programmed into cell2

5) Enable program cycle

1) Erase Mode:

First the whole array 300 is erased in a single cycle. In the erase mode, RWL(N-1), WEQ are logic high, the erase voltage Ve is applied (~10V for 70 Å gate oxide, ~16V for 120 Å gate oxide), and the rest of signals, including WLP, are grounded. Erase affects all cells in the array 300. Ve varies from technology to technology.

2) SRAM Write Mode:

In the SRAM write mode, signals RWL(0) . . . RWL(N-1) are logic high. One of the SRAM word line (WL), e.g., WL(0), should be logic high; the rest of the word lines WL, WL(1) . . . WL(N-1) should be logic low. Signals WLP1, WLP2, WEQS1, WEQS2 are set to logic low and signals WEQ1, WEQ2 are set to logic high to decouple the shared SRAM cell 202 and to set up common ground at Vp1 and Vp2. In order to program cell 200a later, a zero must be written to node RT of the SRAM 202. The corresponding write bit line, e.g., BT(0), should be logic low and bit line BB(0) at logic high. To write a one (cell 200a remains erased) to the SRAM cell 202, the corresponding write bit line, e.g., BB(0), should be logic low and bit line BT(0) at logic high. The number of write cycles depends upon the number of row (N) and the number of columns (M) in the array 300.

3) Dual 4T Cell Program Mode:

Prior to program mode, the SRAM array is preloaded with data as described in (2) and the NVM array is preconditioned in the erase cycle. Signals WLP1, WEQS1 are set to logic high and signal WEQ1 is at logic low. WLP2 is set to logic low and (WEQ2, WEQS2) are set to logic high to inhibit cell 200b from being programmed. RWL(0) . . . RWL(N-1) are logic high. WL(0) . . . WL(N-1) are logic low. The written SRAM cell provides the logic to program cell 200a. Vc is swept from 0 v to $V_{cmax}$. $V_{cmax}$ should be larger than the tunneling condition and depends on technology. The Vc timing sequence is the same as described in (A). Only one cycle is needed.

4) SRAM Write Mode:

RWL(0) . . . RWL(N-1) are logic high. One of the SRAM word lines (WL), e.g., WL(0), should be logic high; the rest of word lines WL, WL(1) . . . WL(N-1) should be logic low. Signals WLP, WLP2, WEQS1, WEQS2 are set to logic low and signals WEQ1, WEQ2 are set to logic high to decouple the SRAM 202 and to set up common ground at Vp1 and Vp2. In order to program cell 200b later, a zero needs to be written to node RB of SRAM 202. The corresponding write bit line, e.g., BB(0), should be logic low and bit line BT(0) at logic high. To write a one (cell 200b remains erased) to the SRAM cell 202, the corresponding write bit line, e.g., BT(0), should be logic low and bit line BB(0) at logic high. The number of write cycles depend upon the number of rows (N) and the number of columns (M) in the array 300.

5) Dual 4T Cell Program Mode:

Prior to program mode, the SRAM array is preloaded with data as descried in (4). (WLP2, WEQS2) is set to logic high and WEQ2 is at logic low. WLP1 is set to logic low and (WEQ1, WEQS1) is set to logic high to inhibit cell 200a from program disturb and second program sequence. RWL(0) . . . RWL(N-1) are logic high. WL(0) . . . WL(N-1) are logic low. The written SRAM cell provides the logic to program cell 200b. Vc is swept from 0 v to $V_{cmax}$. $V_{cmax}$ should be larger than the tunneling condition and depends on technology. The Vc timing sequence is the same as described in (A). Only one cycle is needed.

NVM Read Mode

One of the NVM read word lines (RWL), e.g., RWL(0), should be at logic low; the rest of RWL, RWL(L) . . . RWL(N-1) should be logic high. Set (WLP1, WLP2, WEQS1, WEQS2) to logic low and (WEQ1, WEQ2) to logic high to decouple the SRAM 202 from the NVM cell and to set up a common ground at Vp1 and Vp2. On all read bit lines (RBL (0) . . . RBL1(M-1) and RBL2(0) . . . RBL2(M-1), high current or voltage will be seen if the cell was programmed; a low current or voltage will be seen if the cell was erased. The read voltage Vr is applied to all the cells. The RBL1(0) . . . RBL(M-1) and RBL2(0) . . . RBL2(M-1) will be sensed using two sense amplifier by comparing the current/voltage with a global reference current/voltage. The reference current/voltage is usually provided by a single or a group of the 4T cell replica. These sensed data are latched to output as QM(0) . . . QM(M).

SRAM Read

SRAM read mode: RWL(0) . . . RWL(N-1) are logic high. One of the SRAM word lines (WL), e.g., WL(0), should be logic high; the rest of WL, WL(1) . . . (L(N-1) should be logic low. Signals WLP1, WLP2, WEQS1, WEQS2 are set to logic low and signals WEQ1, WEQ2 are set to logic high. If the cell was written zero, bit line BT will be discharged to ground. If the cell was written one, bit line BB will be discharged to ground. These bit lines are sensed using the SRAM differential sense amplifiers and latched to the output as QN(0) . . . QN(M).

The advantage of the proposed enhancement is to increase the capacity of the memory. The bit cell is decreased by approximately 30% by sharing the SRAM between two NVM bit cell.

Figure 4:
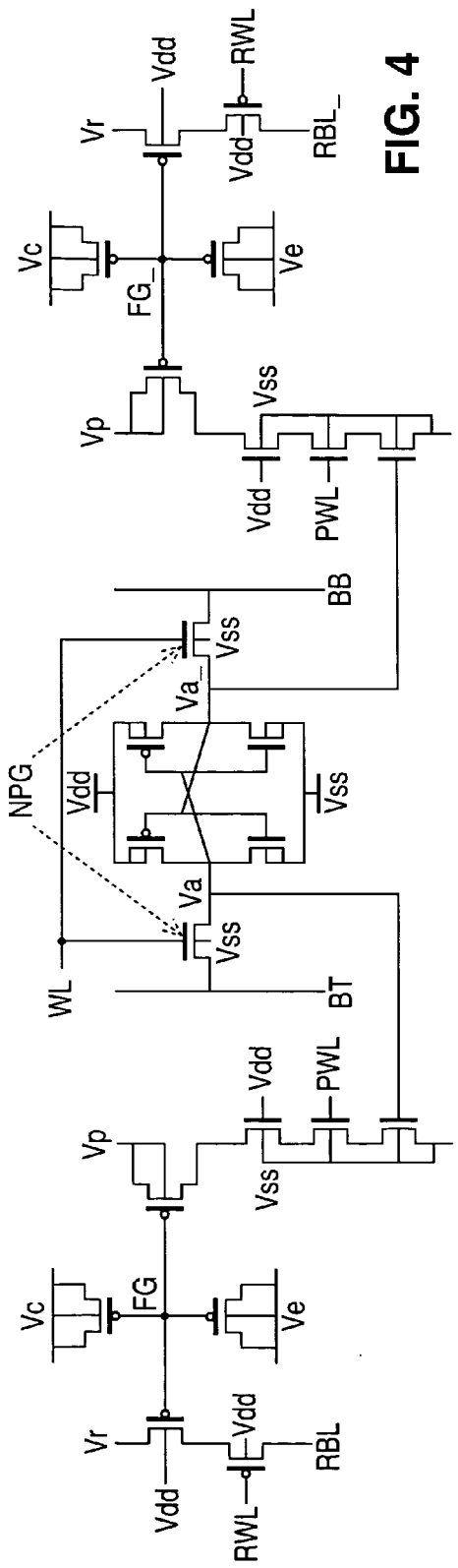
FIG. 4 is a schematic drawing illustrating a dual NVM cell with a 6 transistor SRAM cell.

The same proposed method can be applied to hot carrier programming method. An embodiment of a cell for this application is based upon a known dual 4 transistor NVM cell with shared embedded SRAM, shown in FIG. 4.

Figure 5:
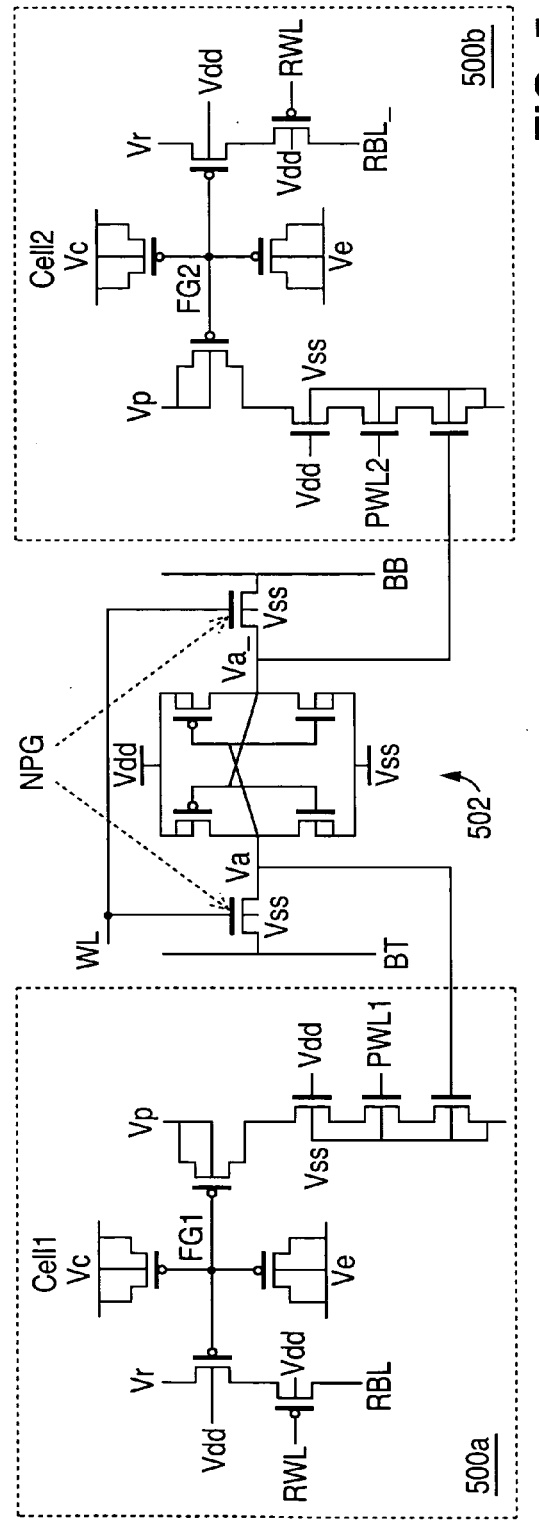
FIG. 5 is a schematic drawing illustrating a single NVM cell with a shared SRAM cell, DC-NPG and CM-NMOS in accordance with the present invention.
Figure 6A:
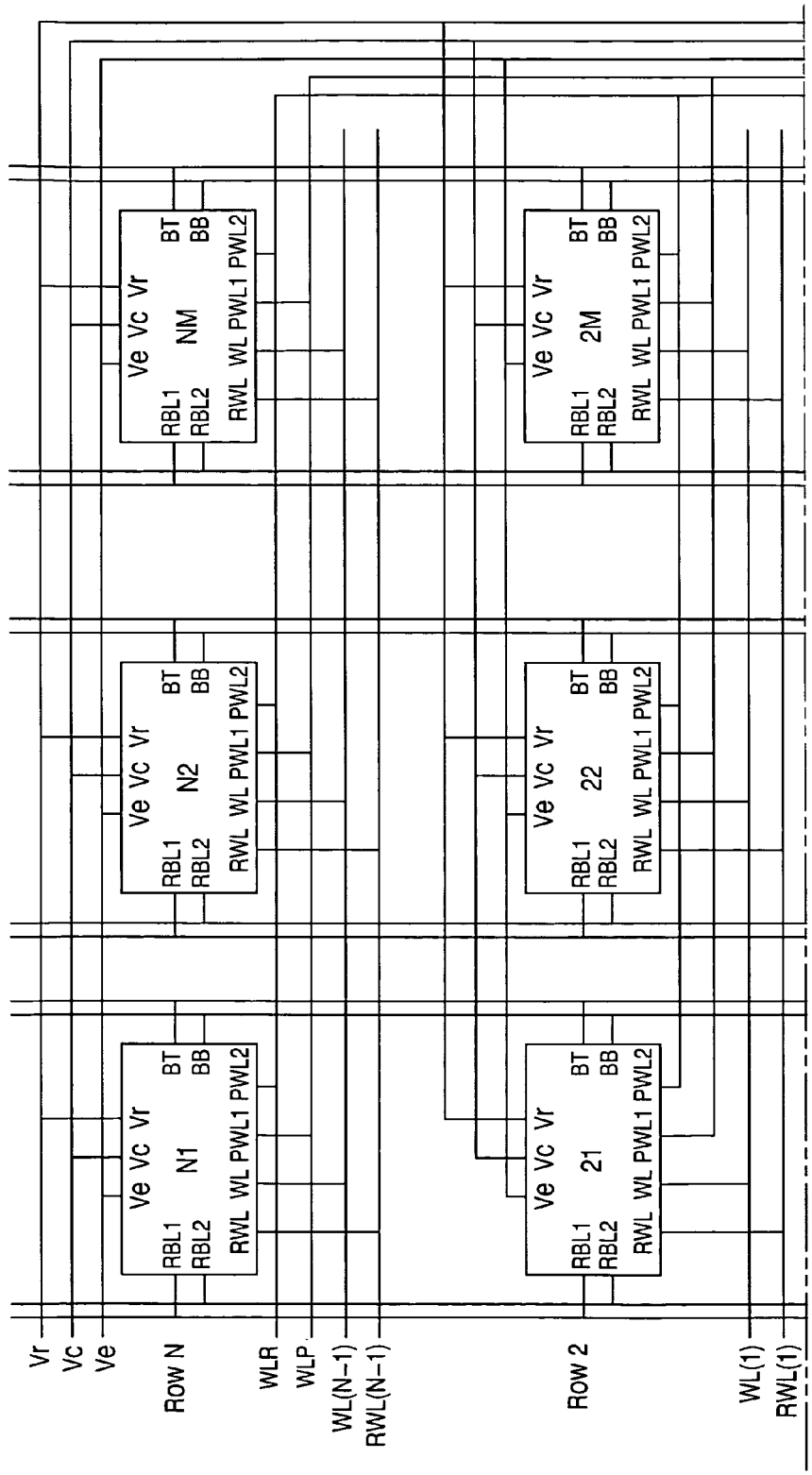
FIG. 6 is a schematic drawing illustrating an array implementation of the NVM cell structure of FIG. 5 in accordance with the present invention.
Figure 6B:
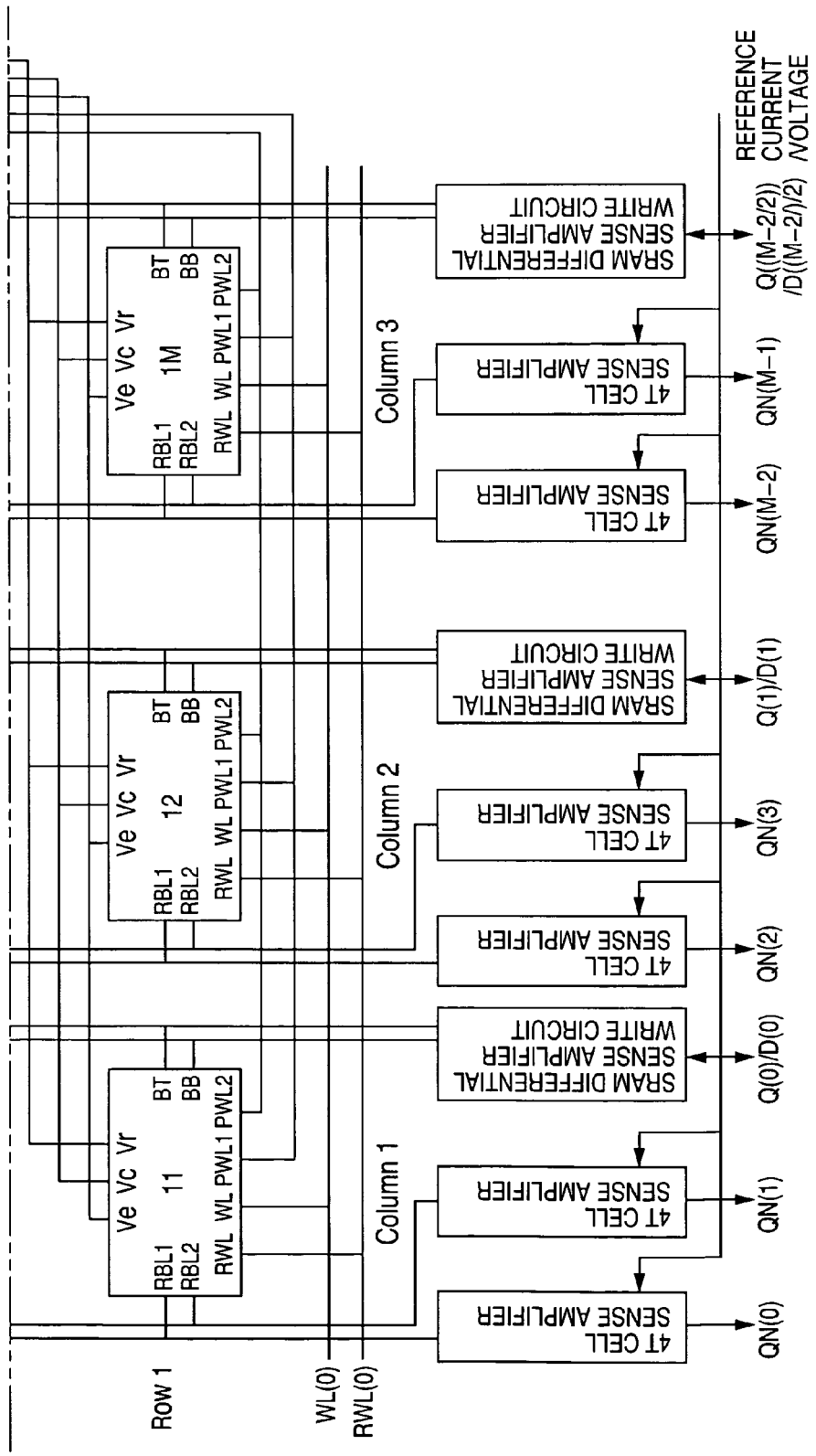

The new cell, shown in FIG. 5, includes two 4T NVM cells 500a, 500b with a 6T SRAM cell 502 embedded. The dual NVM cells 500a, 500b are treated as two separate memory bits, sharing a single SRAM cell 502. Both NVM cells 500a, 500b have their own program control lines, PWL1 and PWL2, respectively, as shown in FIG. 5. The corresponding array implementation is shown in FIG. 6.

Utilizing the FIG. 5 cell architecture, both NVM cells 500a, 500b can now be programmed independently. Since the control line for program is globally connected, to program cell 500a, cell 500b has to be inhibited from cell 500a program and vice versa. This is done by setting PWL2 to ground. To program cell 500a, set PWL1 to Vdd. A Vdd at node Va will program cell 500a. When a high voltage, e.g. 5V, is applied to Vp and PWL1 is Vdd, the high lateral electric field between Vp and ground (FIG. 2A) creates hot electrons. Voltage applied to Vc is coupled through the control transistor to the floating gate (FG1). The gate provides the high perpendicular electric field that attracts electrons to reach the FG. A ground at node Va will inhibit Cell 500a from program.

To program cell 500b, cell 500a is inhibited from being programmed. This is done by setting PWL1 to ground. This will inhibit cell 500a from being programmed. To program cell 500a, set PWL1 to Vdd. A Vdd at node Va will program Cell 500a. When a high voltage, e.g. 5V, is applied to Vp and PWL2 is Vdd, the high lateral electric field between Vp and ground (FIG. 5) creates hot electrons. Voltage applied to Vc is coupled through control transistor to the floating gate (FG2). The gate provides the high perpendicular electric field that attracts electrons to reach the FG. A ground at node Va will inhibit cell 500b from program.

Although only specific embodiments of the present invention are shown and described herein, the invention is not to be limited by these embodiments. Rather, the scope of the invention is to be determined by these descriptions taken together with the attached claims and their equivalents.

What is claimed is:

1. A non-volatile memory (NVM) cell structure comprising:
    a first NVM cell;
    a second NVM cell:
    a static random access memory (SRAM) cell that includes first and second data nodes;
    a first pass gate structure connected between the first NVM cell and the first data node of the SRAM cell, the first pass gate structure being responsive to first and second states of a first pass gate signal to respectively couple and decouple the first NVM cell and the SRAM cell;
    a first equalize structure connected between the first pass gate structure and the first NVM cell and responsive to a first equalize signal to connect the first NVM cell to ground;
    a second pass gate structure connected between the second NVM cell and the second data node of the SRAM cell, the second pass gate structure being responsive to first and second states of a second pass gate signal to respectively couple and decouple the second NVM cell and the SRAM cell; and
    a second equalize structure connected between the second pass gate structure and the second NVM cell and responsive to a second equalize signal to connect the second NVM cell to ground.

2. A NVM cell structure as in claim 1, and wherein each of the first and second NVM cells comprises:
    a P-IGFET programming transistor having a gate electrode connected to a common floating gate node;
    a P-IGFET read transistor having a gate electrode connected to the common floating gate node;
    a P-IGFET erase transistor having a gate electrode connected to the common floating gate node; and
    a P-IGFET control transistor having a gate electrode connected to the common floating gate node.

3. A NVM cell structure as in claim 2, and wherein:
    the first pass gate structure includes a first pass gate NMOS transistor that includes first and second spaced apart diffusion regions defining a channel region therebetween and a gate electrode formed over the channel region, the first diffusion region being connected to the P-IGFET programming transistor of the first NVM cell, the second diffusion region being connected to the first data node of the SRAM cell, and the gate electrode being connected to receive the first pass gate signal; and
    the second pass gate structure includes a second pass gate NMOS transistor that includes first and second spaced apart diffusion regions defining a channel region therebetween and a gate electrode formed over the channel region, the first diffusion region being connected to the P-IGFET programming transistor of the second NVM cell, the second diffusion region being connected to the second data node of the SRAM cell, and the gate electrode being connected to receive the second pass gate signal.

4. A NVM cell structure as in claim 3, and wherein:
    the first equalize structure includes a first equalize NMOS transistor that includes first and second spaced apart diffusion regions defining a channel region therebetween and a gate electrode formed over the channel region, the first diffusion region being connected to the first diffusion region of the first pass gate NMOS transistor, the second diffusion region being connected to ground, and the gate electrode connected to receive the first equalize signal; and
    the second equalize structure includes a second equalize NMOS transistor having first and second spaced apart diffusion regions defining a channel region therebetween and a gate electrode formed over the channel region, the first diffusion region being connected to the first diffusion region of the second pass gate NMOS transistor, the second diffusion region being connected to ground, and the gate electrode being connected to receive the second equalize signal.

5. A NVM cell structure as in claim 4, and wherein:
    the first pass gate structure further includes a first pass gate PMOS transistor that includes first and second spaced apart diffusion regions defining a channel region therebetween and a gate electrode formed over the channel region, the first diffusion region being connected to the first diffusion region of the first pass gate NMOS transistor, the second diffusion region being connected to the second diffusion region of the first pass gate NMOS transistor, and the gate electrode being connected to receive the first equalize signal;
    the second pass gate structure further includes a second pass gate PMOS transistor that includes first and second spaced apart diffusion regions defining a channel region therebetween and a gate electrode formed over the channel region, the first diffusion region being connected to the first diffusion region of the second pass gate NMOS transistor, the second diffusion region being connected to the second diffusion region of the second pass gate NMOS transistor, and the gate electrode is connected to receive the second equalize signal;
    the first equalize structure further includes a first equalize PMOS transistor that includes first and second spaced apart diffusion regions defining a channel region therebetween and a gate electrode formed over the channel region, the first diffusion region being connected to the first diffusion region of the first equalize NMOS transistor, the second diffusion region being connected to the second diffusion region of the first equalize NMOS transistor, and the gate electrode being connected to receive the first pass gate signal; and
    the second equalize structure further includes a second equalize PMOS transistor that includes first and second spaced apart diffusion regions defining a channel region therebetween and a gate electrode formed over the channel region, the first diffusion region being connected to the first diffusion region of the second equalize NMOS transistor, the second diffusion region being connected to the second diffusion region of the second equalize NMOS transistor, and the gate electrode being connected to receive the second pass gate signal.

* * * * *